(12) United States Patent
Watanabe et al.

(10) Patent No.: US 7,660,114 B2
(45) Date of Patent: Feb. 9, 2010

(54) HEAT DISSIPATING MEMBER, HEAT DISSIPATING MECHANISM, AND INFORMATION PROCESSING APPARATUS

(75) Inventors: Hayato Watanabe, Kanagawa (JP); Satoshi Odanaka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/108,103

(22) Filed: Apr. 23, 2008

(65) Prior Publication Data

US 2008/0285229 A1 Nov. 20, 2008

(30) Foreign Application Priority Data

May 15, 2007 (JP) ............... 2007-128796

(51) Int. Cl.
*H05K 7/20* (2006.01)
*H01L 23/34* (2006.01)
(52) U.S. Cl. ............ 361/690; 257/718; 257/719; 361/688; 361/704; 361/715; 361/719
(58) Field of Classification Search ......... 257/719; 361/715, 719
See application file for complete search history.

(56) References Cited

U.S. PATENT DOCUMENTS

| 4,669,028 | A | * | 5/1987 | Faa, Jr. ............... 361/717 |
| 5,526,232 | A | * | 6/1996 | Kolberg et al. ......... 361/715 |
| 6,025,991 | A | * | 2/2000 | Saito ................... 361/704 |
| 6,104,611 | A | * | 8/2000 | Glover et al. .......... 361/700 |
| 6,421,240 | B1 | * | 7/2002 | Patel ................... 361/699 |
| 6,496,375 | B2 | * | 12/2002 | Patel et al. ............ 361/719 |
| 6,515,858 | B2 | * | 2/2003 | Rodriguez et al. ....... 361/695 |
| 6,661,664 | B2 | * | 12/2003 | Sarno et al. ........... 361/719 |
| 6,809,932 | B2 | * | 10/2004 | Wu .................... 361/719 |
| 7,307,844 | B2 | * | 12/2007 | Wu .................... 361/719 |
| 2005/0117303 | A1 | * | 6/2005 | Nagahashi .............. 361/704 |
| 2006/0219852 | A1 | | 10/2006 | Kawai et al. |
| 2006/0221573 | A1 | * | 10/2006 | Li ..................... 361/704 |
| 2006/0256515 | A1 | | 11/2006 | Watanabe |
| 2007/0139897 | A1 | * | 6/2007 | RaghuRam .............. 361/720 |
| 2007/0167055 | A1 | | 7/2007 | Watanabe |
| 2007/0291450 | A1 | | 12/2007 | Watanabe |

FOREIGN PATENT DOCUMENTS

JP 2006-301816 11/2006

* cited by examiner

*Primary Examiner*—Gregory D Thompson
(74) *Attorney, Agent, or Firm*—Oblon, Spivak, McClelland, Maier & Neustadt, L.L.P.

(57) ABSTRACT

A heat dissipating member, a heat dissipating mechanism, and an information processing apparatus capable of improving the cooling efficiency without increasing the size of the apparatus are disclosed. In the information processing apparatus, it becomes possible to effectively transfer heat from a unit such as a memory disposed in an inner space of the apparatus to the outside regardless of the layout position of the unit by using the heat dissipating mechanism fixed to a unit and a heat dissipation surface so that the heat is transferred from the unit to the heat dissipation surface.

11 Claims, 4 Drawing Sheets

HEAT DISSIPATING MEMBER, HEAT DISSIPATING MECHANISM, AND INFORMATION PROCESSING APPARATUS

BACKGROUND OF THE INVENTION

1. Field of the Invention

The present invention generally relates to a heat dissipating member, a heat dissipating mechanism, and an information processing apparatus, and more particularly to a heat dissipating member for transferring heat from a heat generating part to a heat dissipation surface, a heat dissipating mechanism for transferring heat from a heat generating part to a heat dissipation surface, and an information processing apparatus including the heat dissipating mechanism.

2. Description of the Related Art

Conventionally, a forced cooling method and a natural cooling method have been widely used to cool electronic parts mounted on a substrate in an information processing apparatus such as a controller for a device integrated in a system such as a vending machine or a ticket vending machine. In the forced cooling method, cooling air is forcibly supplied to electronic parts with, for example, a cooling fan. On the other hand, in the natural cooling system, an opening is formed on a chassis accommodating electronic parts, and heat from the electronic parts is discharged to the outside of the chassis by heated rising air (convection current).

However, when the forced cooling method is used, a cooling fan is required to be added inside the chassis, thereby increasing the size of the chassis and making it difficult to maintain the quietness of the apparatus due to the noise generated when the cooling fan is operating. On the other hand, when an information processing apparatus using the natural cooling method is installed at a site where no environmental control is practiced such as in the open air, undesirable air currents countering the rising air current may occur, thereby preventing the generated heat from dissipating from the chassis, or foreign material may be introduced into the chassis, thereby damaging the apparatus.

To solve the problems, a third cooling method is proposed. In the cooling method, one surface of a substrate is disposed in the vicinity of the inner wall surface of the chassis and high heat generating parts are mounted on the surface; other parts are mounted on the opposite surface of the substrate so that the heat from the high heat generating parts is transferred to the outside through the chassis working as a heat sink. However, in this method, the substrate is required to be separated from the inner wall surface of the chassis by some distance. Because of this structure, unfortunately, it is difficult to further improve the cooling efficiency. In addition, the substrate is required to be substantially parallel to the inner wall surface of the chassis. Because of this limitation, when plural substrates are required to be disposed in the chassis, the degree of freedom in designing the layout of the substrates is reduced and the size of the apparatus is increased.

SUMMARY OF THE INVENTION

The present invention is made in light of the problems, and may provide a heat dissipating member capable of efficiently dissipating heat from the electronic parts mounted on a substrate.

Further, the present invention may provide a heat dissipating mechanism capable of efficiently dissipating heat from the electronic parts mounted on a substrate.

Still further, the present invention may provide an information processing apparatus capable of efficiently cooling the apparatus without increasing the size of the apparatus.

According to a first aspect of the present invention, there is provided a heat dissipating member for dissipating heat from heat generating parts mounted on a substrate disposed at a prescribed angle with respect to a heat dissipation surface, where the heat dissipating member includes a first heat dissipating part formed on one side of the heat dissipating member and in contact with the heat dissipation surface, and a second heat dissipating part formed on the other side of the heat dissipating member and including a contact surface in contact with the heat generating parts.

According to this aspect, the heat dissipation surface and the substrate disposed at a prescribed angle with respect to the heat dissipation surface are connected through the heat dissipating member, therefore enabling efficient transfer of the heat from the heat generating parts mounted on the substrate to the heat dissipation surface disposed at a prescribed angle with respect to the substrate.

According to another aspect of the present invention, there is provided a heat dissipating mechanism for dissipating heat from heat generating parts mounted on a substrate disposed at a prescribed angle with respect to a heat dissipation surface, where the heat dissipating mechanism includes a first heat dissipating member, one side of the first heat dissipating member is in contact with the heat dissipation surface, a contact surface in contact with one surface of the heat generating parts is formed on the other side of the first heat dissipating member, and one side of a second heat dissipating member is in contact with the heat dissipation surface, where the other side of the second heat dissipating member included a contact surface in contact with the other surface of the heat generating parts.

According to this aspect, the heat dissipation surface and both sides of the substrate disposed at a prescribed angle with respect to the heat dissipation surface are connected through the heat dissipating mechanism, thereby enabling efficient transfer of the heat from the heat generating parts mounted on the substrate to the heat dissipation surface disposed at a prescribed angle with respect to the substrate.

According to still another aspect of the present invention, there is provided an information processing apparatus including a substrate on which heat generating parts are mounted, where the information processing apparatus includes a chassis accommodating the substrate and the heat dissipating mechanism as described above transfers heat from the heat generating parts mounted on the substrate to a surface disposed at a prescribed angle with respect to the substrate in the chassis.

According to this aspect, the information processing apparatus includes the heat dissipating mechanism according to an embodiment of the present invention. Therefore, it is possible to effectively dissipate the heat from the electronic parts mounted on the substrate. Accordingly, the inside of the chassis can be effectively cooled. Further, it is not always necessary for the substrate to be parallel to the inner wall surface of the chassis. Therefore, the degree of freedom in designing the layout is increased and the size of the apparatus can be reduced.

BRIEF DESCRIPTION OF THE DRAWINGS

Other objects, features, and advantages of the present invention will become more apparent from the following descriptions when read in conjunction with the accompanying drawings, in which.

DETAILED DESCRIPTION OF THE PREFERRED EMBODIMENTS

Figure 1:
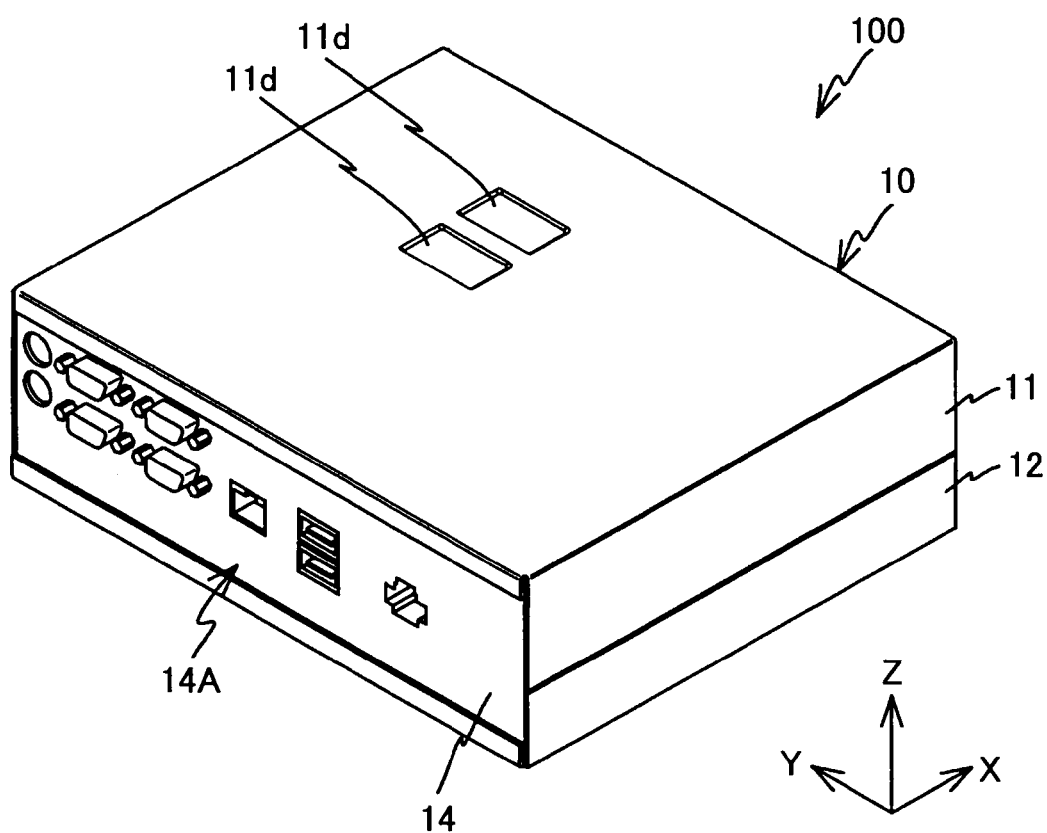
FIG. 1 is a perspective view showing an information processing apparatus according to an embodiment of the present invention.
Figure 2:
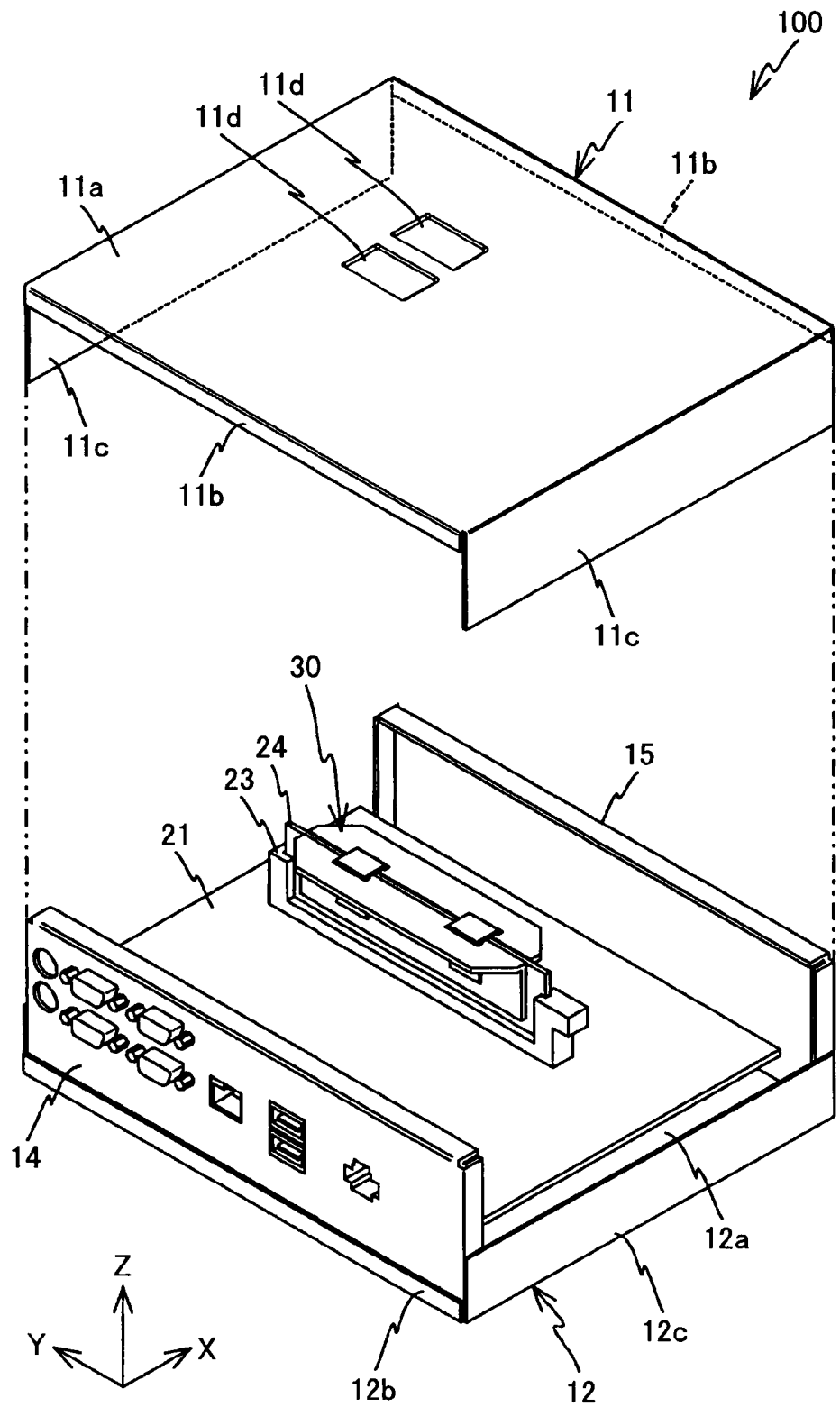
FIG. 2 is a partially exploded perspective view of the information processing apparatus.

In the following, an embodiment of the present invention is described with reference to FIGS. 1 through 4. FIG. 1 is a perspective view of an information processing apparatus 100 according to an embodiment of the present invention. FIG. 2 is a partially exploded perspective view of the information processing apparatus 100. The information processing apparatus 100 may be used in a vending machine or a ticket vending machine. As FIGS. 1 and 2 show, the information processing apparatus 100 includes a chassis 10 having an upper cover 11, a lower cover 12, a front panel 14, and the rear panel 15. The upper cover 11 and the lower cover 12 engage each other in the up-and-down direction. The front panel 14 is fixed to end portions on the −X side of the upper cover 11 and the lower cover 12. Plural external input terminals are mounted on the front panel 14. The rear panel 15 is fixed to end portions on the +X side of the upper cover 11 and the lower cover 12.

The upper cover 11 is formed by applying a sheet metal processing to an anodized aluminum sheet. As shown in FIG. 2, the cover 11 includes a top plate part 11a, a pair of engaging parts 11b, a pair of side wall parts 11c, and convex parts 11d. The top plate part 11a has a substantially square shape in plan view. The pair of engaging parts 11b are formed along fringes on the +X side and the −X side of the lower surface of the top plate part 11a with the longitudinal direction of the engaging parts 11b parallel to the Y axis direction. The pair of side wall parts 11c are formed along fringes on the +Y side and −Y side of the lower surface of the top plate part 11a with the longitudinal directions of the side wall parts 11c parallel to the X axis direction. The convex parts 11d are formed in a rectangular shape and disposed side by side in the X axis direction in the vicinity of the center of the top plate part 11a.

Similar to the upper cover 11, the lower cover 12 is formed by applying a sheet metal process to an anodized aluminum sheet. The lower cover 12 includes a bottom plate part 12a, a pair of engaging parts 12b, and a pair of side wall parts 12c. The bottom plate part 12a has a substantially square shape in plan view. The pair of engaging parts 12b are formed along fringes on the +X side and the −X side of the upper surface of the bottom plate part 12a with the longitudinal direction of the engaging parts 12b parallel to the Y axis direction. The pair of side wall parts 12c are formed along fringes on the +Y side and −Y side of the upper surface of the bottom plate part 12a with the longitudinal directions of the side wall parts 11c parallel to the X axis direction.

The front panel 14 is formed by applying a sheet metal process to an anodized aluminum sheet, and has a rectangular plate shape with its longitudinal direction parallel to the Y axis direction. As shown in FIG. 1, an interface 14A is formed on the front panel 14. The interface 14A includes a power connector, a USB terminal, a mouse terminal, a serial connector, and Local Area Network (LAN) adaptor so as to provide electrical connections between the information processing apparatus 100 and external peripherals.

The rear panel 15 is formed by applying a sheet metal process to an anodized aluminum sheet, and has a rectangular plate shape with its longitudinal direction parallel to the Y axis direction.

The chassis 10 is formed by assembling the upper cover 11, the lower cover 12, the front panel 14 and the rear panel 15 as follows. As illustrated in FIG. 2, the lower parts of the front panel 14 and the rear panel 15 engage and fix the corresponding engage parts 12b of the lower cover 12 with, for example, screws (not shown). Then, the upper parts of the front panel 14 and the lower panel 15 engage and fix the corresponding engage parts 11b of the upper cover with, for example, screws (not shown). As a result, an inner space defined by the upper cover 11, the lower cover 12, the front panel 14 and the rear panel 15 is formed.

As shown in FIG. 2, the inner space of the chassis 10 accommodates, for example, electronic parts such as a CPU and a chipset, a substrate 21 on which a slot 23 with a memory 24, and a heat dissipating mechanism 30 mounted on the memory 24.

The substrate 21 may be a general-purpose motherboard conforming to ATX standards used in a personal computer. The substrate 21 is supported substantially horizontally by a supporting member (not shown) provided on the upper surface of the lower cover 12 so that the substrate 21 is separated from the upper surface of the lower cover by a prescribed distance.

The memory 24 includes a substantially rectangular substrate and plural electronic parts. The plural electronic parts are mounted on both sides of the substrate and are capable of recording information.

Figure 3:
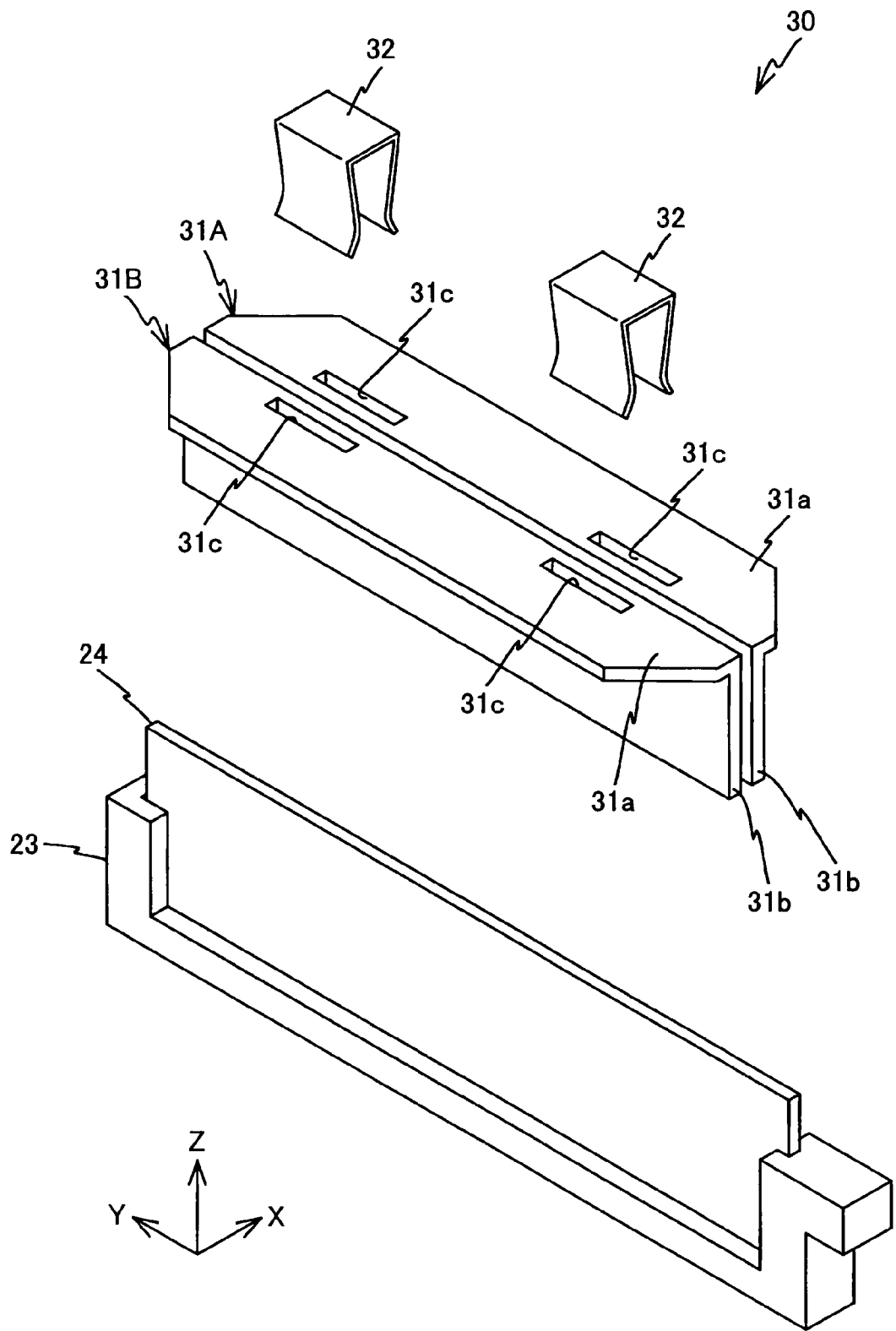
FIG. 3 is an exploded perspective view of a heat dissipating mechanism.

As shown in FIG. 3, the slot 23 is provided on the substrate 21 with the longitudinal direction of the slot 23 parallel to the Y axis direction, and removably holds the memory 24. The memory 24 is installed in the slot 23 so as to provide electronic connections with, for example, the electronic parts mounted on the both sides of the substrate 21.

FIG. 3 is an exploded perspective view showing the heat dissipating mechanism 30 along with the slot 23 and the memory 24. As shown in FIG. 3, the heat dissipating mechanism 30 includes a pair of heat dissipating members 31A and 31B and two clips 32.

Each of the heat dissipating members 31A and 31B is L-shaped in cross section and includes two parts: a contacting part 31b and a connecting part 31a. The contacting part 31b has a substantially rectangular shape and disposed perpendicular to the X axis direction with the longitudinal direction of the contacting part 31b parallel to the Y axis direction. The connecting part 31a has a substantially trapezoidal shape and is extended in the X axis direction from the top end of the contacting part 31b. Further, two openings with the longitudinal direction parallel to the Y axis direction are formed on the connecting part 31a and separated from each other in the Y axis direction by a prescribed distance The clip 32 is a U-shaped elastic member having a pair of gripping parts facing each other.

Figure 4:
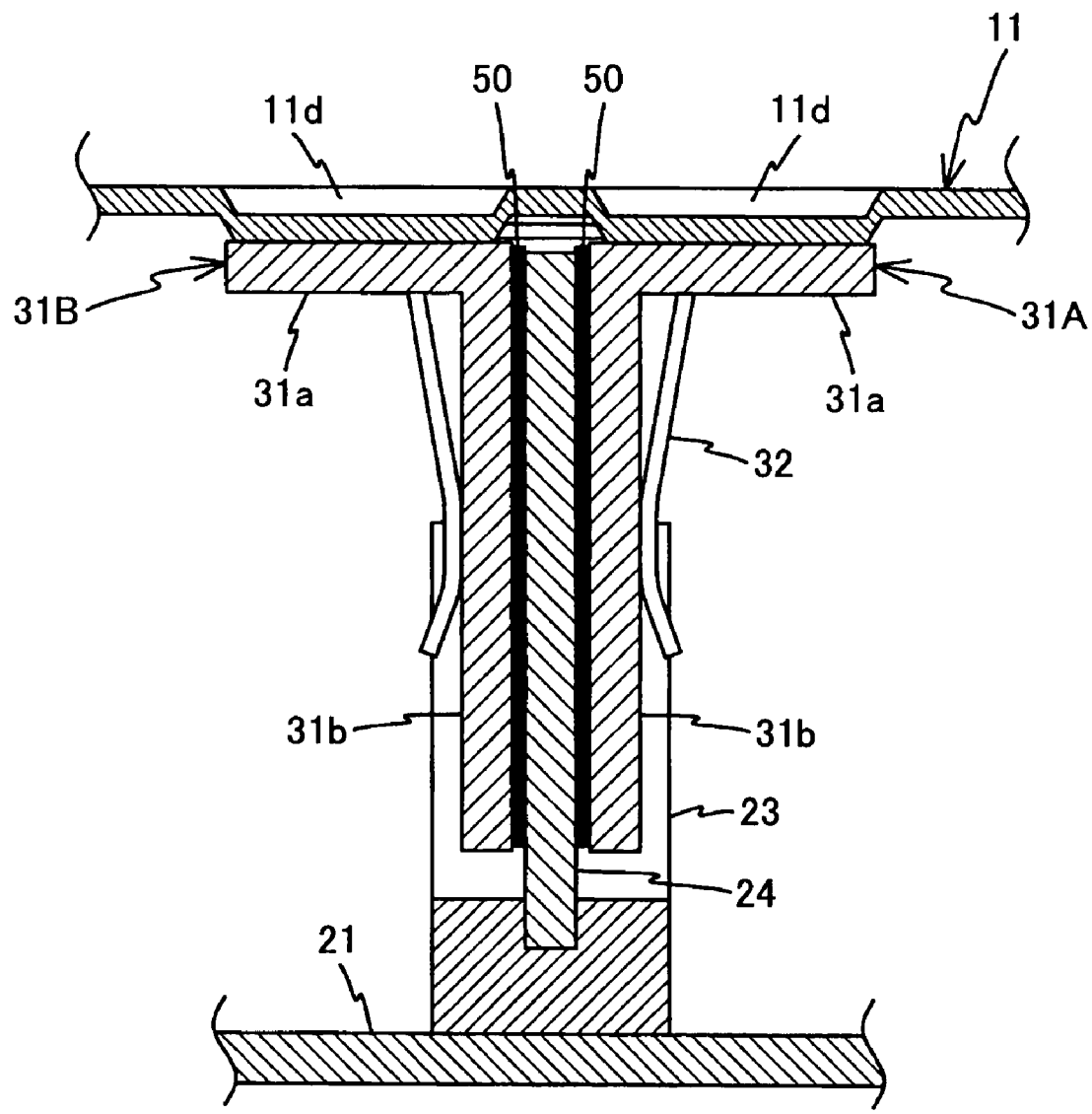
FIG. 4 is a cut-open view of the heat dissipating mechanism.
Figure 4:
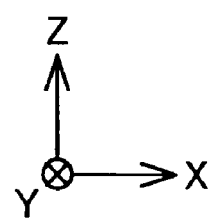

FIG. 4 is a cut-open view of the heat dissipating members 31A and 32B in a practical configuration. As FIGS. 3 and 4 illustrate, in the information processing apparatus 100, the pair of heat dissipating members 31A and the 31B are disposed so that facing surfaces of the contacting parts 31b of the heat dissipating members 31A and the 31B are in contact with the corresponding surfaces on the +X side and the −X side of the memory 24 through elastic members 50 having relatively high heat conductivity. Further, the other surface of the contacting parts 31b of the heat dissipating members 31A and the 31B are pressed inward to the memory 24 by the gripping parts of the clips 32 disposed through the openings 31c formed on the heat conducting members 31A and 31B so that the contacting parts 31b are fixed to the memory 24.

Further, as shown in FIG. 4, an upper surface of the connecting parts 31a of the heat dissipating members 31A and 31B fixed to the memory 24 are attached firmly to a lower surface of the convex part 11d formed on the upper cover 11 with, for example, screws (not shown).

As described above, in the information processing apparatus 100, the heat dissipating mechanism 30 is fixed to the memory 24 disposed in the inner space of the chassis 10. Therefore, the heat from the electronic parts on the both sides of the memory 24 can be efficiently dissipated to the inner wall surface of the chassis 10 through the heat dissipating members 31A and 31B, the inner wall surface being substantially perpendicular to the substrate of the memory 24. Further, because of this structure, the heat from the electronic parts of the memory 24 is dissipated to the outside of the chassis 10 by using the heat dissipating members 31A and 31B and the upper cover 11 as heat sinks, thereby enabling efficient cooling of the inner space of the chassis 10.

Further, when an electronic device generating relatively high heat such as a CPU is disposed in the vicinity of the memory 24, heat transferred to the memory 24 is dissipated to the outside of the chassis 10 effectively, thereby enabling the reduction of negative thermal influence in the information processing apparatus 100.

Still further, according to this embodiment of the present invention, each contacting part 31b of the heat dissipating members 31A and 31B is in contact with the memory 24 through the elastic member 50. Because of this structure, the degree of adhesion between the heat dissipating members 31A and 31B and the memory 24 is improved, thereby enabling efficient heat transfer from the memory 24 to the upper cover 11.

Still further, according to this embodiment of the present invention, the clips 32 grip the memory 24 through the contacting parts 31b of the heat dissipating members 31A and 31B. Because of this structure, the contacting parts 31b of the heat dissipating members 31A and 31B are pressed inward to the memory 24, thereby reducing the contact heat resistance between the memory 24 and the heat dissipating members 31A and 31B. As a result, it becomes possible to effectively transfer the heat from the memory 24 to the upper cover 11.

Still further, the heat dissipating mechanism 30 effectively dissipates the heat from the memory 24 to the top plate part 11a of the upper cover 11. Because of this feature, it becomes possible to lay out the memory 24 on the substrate 21 flexibly. In addition, for example, when a layout of plural memories 24 on the substrate 21 is designed, it is not always necessary to consider the heat interference among plural the memories 24. As a result, the degree of freedom in designing the layout is increased and the size of the apparatus is reduced.

Still further, the convex parts 11d are formed on the upper cover 11 so as to contact the connecting parts 31a of the heat dissipating members 31A and 31B. Because of this structure, the degree of adhesion between the heat dissipating members 31A and 31B and the upper cover 11 is improved, thereby enabling efficient heat transfer from the memory 24 to the upper cover 11.

It should be noted that in this embodiment of the present invention, the heat dissipating mechanism 30 is fixed to the memory 24. However, the present invention is not limited to this configuration. For example, the heat dissipating mechanism 30 may be fixed to a unit including a substrate and electronic parts mounted on the substrate.

Further, the angle formed between the substrate and the inner wall surface of the chassis 10 is not necessarily perpendicular. The substrate may be inclined with respect to the inner surface. In such a case, the angle between the connecting part 31a and the contacting part 31b of the heat dissipating members 31A and 31B is adjusted to fit the inclination of the substrate.

Still further, when the amount of heat from the memory 24 is large, the size of the heat dissipating members 31A and 31B may be increased, or another cooling mechanism such as a cooling fan may be added to the heat dissipating mechanism 30.

Still further, electronic parts accommodated in the information processing apparatus 100 are not limited to the parts described above.

Still further, in the above embodiment, the information processing apparatus 100 is installed horizontally. However, the present invention is not limited to this configuration. For example, the information processing apparatus may be installed vertically.

As described above, a heat dissipating member according to an embodiment of the present invention can be desirably used to transfer heat from electronic parts to a cooling surface. Further, a heat dissipating mechanism according to an embodiment of the present invention can be desirably used to transfer heat from electronic parts to a cooling surface. Still further, an information processing apparatus according to an embodiment of the present invention is desirably applicable to a controller capable of being integrated into an external apparatus.

The present invention is not limited to the above embodiments, and variations and modifications may be made without departing from the scope of the present invention.

The present application is based on and claims the benefit of priority of Japanese Patent Application No. 2007-128796, filed on May 15, 2007, the entire contents of which are hereby incorporated herein by reference.

What is claimed is:

1. A heat dissipating mechanism for dissipating heat from a heat generating part mounted on a substrate having two substantially planar and parallel sides, said substrate being accommodated in a chassis having a portion comprising an external surface of the chassis providing a heat dissipation surface, said portion of the chassis also comprising an internal surface extending substantially parallel to the external surface, wherein said surfaces of said portion of the chassis extend at an angle to said sides of the substrate, the heat dissipating mechanism comprising:

a contacting part and a connecting part mutually arranged at said angle, wherein said contacting part of the heat dissipating mechanism has a substantially planar surface in conductive heat transfer contact with a majority of one of said sides of said substrate, and wherein said connecting part of the heat dissipating mechanism has a substantially planar surface in conductive heat transfer contact with said internal surface of said portion of the chassis.

2. The heat dissipating member according to claim 1, further comprising:

an elastic member provided between said contacting part of the heat dissipating mechanism and one of the sides of said substrate.

3. A heat dissipating mechanism for dissipating heat from heat generating parts mounted on a substrate having two substantially planar and parallel sides, said substrate being accommodated in a chassis having a portion comprising an external surface of the chassis providing a heat dissipation surface, said portion of the chassis also comprising an internal surface extending substantially parallel to the external surface, wherein said surfaces of said portion of the chassis extend at an angle to said sides of the substrate, the heat dissipating mechanism comprising:

first and second heat dissipating members, wherein the first heat dissipating member comprises a contacting part and a connecting part mutually arranged at said angle, wherein said contacting part of said first heat dissipating member has a substantially planar surface in conductive heat transfer contact with a majority of one of said sides of said substrate, and wherein said connecting part of said first heat dissipating member has a substantially planar surface in conductive heat transfer contact with said internal surface of said portion of the chassis, and wherein the second heat dissipating member comprises a contacting part and a connecting part mutually arranged at said angle, wherein said contacting part of said second heat dissipating member has a substantially planar surface in conductive heat transfer contact with a majority of the other of said sides of said substrate, and wherein said connecting part of said second heat dissipating member has a substantially planar surface in conductive heat transfer contact with said internal surface of said portion of the chassis.

4. The heat dissipating mechanism according to claim 3, further comprising:

a pressing member pressing the contacting parts of each of said first and second heat dissipating members to said sides of the substrate.

5. The heat dissipating mechanism according to claim 4, wherein the pressing member grips the substrate through the first heat dissipating member and the second heat dissipating member.

6. The heat dissipating mechanism according to claim 3, further comprising:

a first heat conductive elastic member provided between said substantially planar surface of the first heat dissipating member and the majority of one of the sides of said substrate; and a second heat conductive elastic member provided between said substantially planar surface of the second heat dissipating member and the majority of one of the other of said sides of said substrate.

7. An information processing apparatus including a substrate on which heat generating parts are mounted, the substrate having two substantially planar and parallel sides, the information processing apparatus comprising:

a chassis accommodating the substrate, the chassis having a portion comprising an external surface of the chassis providing a heat dissipation surface, said portion of the chassis also comprising an internal surface extending substantially parallel to the external surface, wherein said surfaces of said portion of the chassis extend at an angle to said sides of the substrate;

a heat dissipating mechanism comprising first and second heat dissipating members, wherein the first heat dissipating member comprises a contacting part and a connecting part mutually arranged at said angle, wherein said contacting part of said first heat dissipating member has a substantially planar surface in conductive heat transfer contact with a majority of one of said sides of said substrate, and wherein said connecting part of said first heat dissipating member has a substantially planar surface in conductive heat transfer contact with said internal surface of said portion of the chassis, and wherein the second heat dissipating member comprises a contacting part and a connecting part mutually arranged at said angle, wherein said contacting part of said second heat dissipating member has a substantially planar surface in conductive heat transfer contact with a majority of the other of said sides of said substrate, and wherein said connecting part of said second heat dissipating member has a substantially planar surface in conductive heat transfer contact with said internal surface of said portion of the chassis; and a pressing member pressing the contacting parts of each of said first and second heat dissipating members to said sides of the substrate.

8. The information processing apparatus according to claim 7, further comprising:

a first heat conductive elastic member provided between said substantially planar surface of the first heat dissipating member and the majority of one of the sides of said substrate; and a second heat conductive elastic member provided between said substantially planar surface of the second heat dissipating member and the majority of one of the other of said sides of said substrate.

9. The information processing apparatus according to claim 7, wherein said portion of the chassis having said internal surface is recessed into the interior of said chassis.

10. The information processing apparatus according to claim 7, wherein said contacting part and said connecting part of each of said first and second heat dissipating members are unitarily formed.

11. The information processing apparatus according to claim 7, wherein said angle is substantially 90°.

* * * * *